United States Patent
Whatmore

(10) Patent No.: US 6,329,656 B1
(45) Date of Patent: Dec. 11, 2001

(54) FERROELECTRIC CERAMICS

(75) Inventor: Roger William Whatmore, Bletchley (GB)

(73) Assignee: Infrared Integrated Systems, Limited (GB)

( * ) Notice: Subject to any disclaimer, the term of this patent is extended or adjusted under 35 U.S.C. 154(b) by 0 days.

(21) Appl. No.: 09/510,570

(22) Filed: Feb. 22, 2000

(30) Foreign Application Priority Data

Feb. 22, 1999 (GB) .................................. 9904027

(51) Int. Cl.$^7$ ................................. H01L 37/00; G01J 5/00; H01B 3/12

(52) U.S. Cl. .................................. 250/338.2; 250/338.3; 501/136

(58) Field of Search ............................. 250/338.2, 338.3, 250/338.1, 336.1; 501/136, 137, 139, 152, 138

(56) References Cited

U.S. PATENT DOCUMENTS

| | | |
|---|---|---|
| 3,775,531 | 11/1973 | Smith . |
| 4,751,209 * | 6/1988 | Yokotami et al. ................... 501/138 |
| 4,869,840 * | 9/1989 | Osbond et al. ................... 250/338.3 |

FOREIGN PATENT DOCUMENTS

0484231A1   5/1992   (EP) .

OTHER PUBLICATIONS

U.K. Search Report for Application GB 9904027.1.
WPI Abstract Accession No. 90–102151[14].
WPI Abstract Accession No. 89–35317[25].
Patent Abstract of Japan, Application No.: 04325478; Publication No.: 06176617.
Patent Abstract of Japan, Application No.: 63201634; Publication No.: 02051426.
Publication Piezoelectric Properties of PG (mg $\frac{1}{3}$ NB$\frac{2}{3}$) O$_3$–PGTio$_3$–PGZro$_3$Ceramics Modified with Certain Additives; vol. 49 No. 11 pp. 577–582; dated Nov. 21, 1966.
Publication Piezoelectric Properties of PG (Mg $\frac{1}{3}$Nb$\frac{2}{3}$)–O$_3$ PGTio$_3$–PGZro$_3$ Solid Solution Ceramics; vol. 48 No. 12 pp. 630–635 dated Dec. 1965.
European Search Report Application No.: EP 00 30 1358.

* cited by examiner

Primary Examiner—Hung Xuan Dang
(74) Attorney, Agent, or Firm—Philip Curtis; Marlin R. Smith

(57) ABSTRACT

A ferroelectric ceramic for use as a pyroelectric is provided. In a disclosed embodiment, the ceramic has the composition:

$$Pb_{1+\delta}\{[(Mg_{1/3}Nb_{2/3})_y(Zr_{1-x}Ti_x)_{1-y}]_{1-z}A_z\}O_3$$

where: $0.05 \geq 67 \geq 0$ $0.42 \geq x > 0$ $0.42 \geq y > 0$ $0.05 \geq z > 0$ and wherein A is a cationic multivalent octahedral site substituent.

The ferroelectric ceramic is useful as an active pyroelectric material in infrared detecting devices.

55 Claims, 3 Drawing Sheets

FERROELECTRIC CERAMICS

CROSS-REFERENCE TO RELATED APPLICATION

This application claims the benefit of the filing date of U.K. application Ser. No. 9904027.1, filed Feb. 22, 1999, the disclosure of which is incorporated herein by this reference.

BACKGROUND OF THE INVENTION

The present invention relates generally to ferroelectric ceramics and, in an embodiment described herein, more particularly provides a ferroelectric ceramic having enhanced usefulness in a pyroelectric infra-red detector.

The use of ferroelectric ceramics as the active detector material for pyroelectric infra-red (IR) detectors is known. The range of pyroelectric devices and the various single crystal, polymeric and ceramic materials which have been used as the active material in them is described in detail in, for example, a paper entitled "Pyroelectric Devices and Materials" by R. W. Whatmore, 49 Rep. Prog. Phys. 1335–1386 (1986), which is incorporated herein by this reference. The paper also discloses figures-of-merit which can be used to decide whether or not one material is more suitable than another for a particular type of pyroelectric device. These figures-of-merit are various combinations of the physical properties of the pyroelectric material and are directly related to the performance of the devices of interest. The most commonly used figures-of-merit are:

$$F_I = p/c' \tag{1}$$

where the current responsivity of the device is proportional to $F_I$;

$$F_v = p/(c' \epsilon_0 \epsilon) \tag{2}$$

where the voltage responsivity of the device is proportional to $F_v$; and $$F_D = p/(c'(\epsilon_0 \epsilon \tan \delta)^{0.5}) \tag{3}$$

where the specific detectivity of the device is proportional to $F_D$.

In these formulae:
p=pyroelectric coefficient;
c'=volume specific heat;
$\epsilon$=dielectric permittivity at the frequency of device operation;
tan δ=dielectric loss tangent at the frequency of device operation; and
$\epsilon_0$=dielectric permittivity of free space.

In an ideally-matched pyroelectric device the input capacitance of the amplifier linked to the pyroelectric element would be similar in magnitude to that of the element itself. In this cases the figure-of-merit $F_D$ is the most important one to use. In devices where the element capacitance is much larger than the amplifier capacitance, or where the AC Johnson Noise in the element does not dominate in the noise figure for the device, $F_V$ is the appropriate figure-of-merit to use. In cases where the element capacitance is much smaller than the amplifier capacitance, then $F_i$ is the appropriate figure-of-merit to use.

Table 1 shows the pyroelectric properties of some of the commercially-available materials for pyroelectric applications. All the commercial pyroelectric ceramic materials are based upon modifications to the perovskite ceramic solid solution system lead zirconate—lead titanate ($PbZrO_3$—$PbTiO_3$—hereinafter called "PZT"). The vast majority of these are based upon lead titanate ($PbTiO_3$—hereinafter called "PT"). An example is the composition $(Pb_{1-x}Ca_x)((Co_{1/2}W_{1/2})yTi_{1-y})O_3$ with x=0.24, y=0.04, which was described in a paper by N. Ichinose, 64 Am. Ceram. Soc. Bull. 1581–1585 (1985). Typical properties for such ceramics are listed under the heading of "modified PT" given in Table 1. These values have been measured on a modified lead titanate ceramic manufactured by Morgan Matroc Unilator Division and known as PC6.

A particular commercial family of pyroelectric ceramics has also been developed based upon PZT compositions close to lead zirconate, ($PbZrO_3$—hereinafter called "PZ") in this case in solid solution with lead iron niobate ($PbFe_{0.5}Nb_{0.5}O_3$) which was described in a paper by R. W. Vtiatmore and A. J. Bell (35 Ferroelectrics 155–160 (1981)). In this case uranium is added as a dopant to control the electrical conductivity. The properties of this ceramic, which is supplied commercially by GEC Marconi Materials Techluology are listed in Table 1 under heading "Modified PZ".

Other authors have described ceramic compositions which are particularly suitable for piezoelectric applications. A paper by H. Ouchi, K. Nagano and S. Hayakawa (48 J. Amer. Ceram. Soc. (12) 630–635 (1965)) discloses the piezoelectric and high frequency (>1 KHz) dielectric properties of coinpositions throughout the phase diagram. The compositions disclosed in this reference are based on PZ, PT and lead magnesium niobate (hereinafter called "PMN"). It should be noted that none of the properties reported in this reference would be of use in predicting the properties of a pyroelectric device using them. While the dielectric properties (permittivity and loss) might at first sight seem useful in providing some data for the computation of pyroelectric figures-of-merit, according to the formulae given here, the frequency at which the properties are measured should be in the same range as those used in practical pyroelectric devices (usually <100 Hz). This is particularly important for the dielectric loss, which can rise rapidly as the frequency is reduced below 100 Hz. Compositions cited in this reference are shown in the PZ-PT-PMN ternary phase diagram shown in FIG. 1.

A paper by H. Ouchi, M. Nishida and S. Hayakawa (49 J. Amer. Ceram. Soc. (11) 557–582(1966)) discloses the piezoelectric and high frequency (>1 KHz) dielectric properties of a much more restricted set of compositions of the form $Pb[(Mg_{1/3}Nb_{2/3})_{0.375}Zr_{0.375}Ti_{0.25}]O_3$ with small additions (0.2 to 1.0 m $Cr_2O_3$, $Fe_2O_3$ or NiO.

A paper by H. Ouchi (51 J. Amer. Ceram. Soc. (3) 169–176 (1968)) discloses the piezoelectric and high frequency (>1 KHz) dielectric properties of compositions in the PZ-PT-PMN ternary system with small (up to 10 mole %) substitutions of Ba or Sr for Pb. None of these papers describes the pyroelectric or low frequency dielectric properties, which would be relevant to the applications in pyroelectric infra-red detectors.

Three papers have also been published which describe the pyroelectric properties of ceramics in related compositional systems. These are by, M. Kobune, S, Fujii and K. Asada (104 J. Ceram. Soc. Japan (4) 259–263(1984)); S. W. Choi, S. J. Jang and A. Bhalla (22 J. Korean Physical Society (1) 91–96 (1989)); and M. M. Abou Sekkina and A. Tawfik (3 J. Mat. Sci. Let. 733–738 (1984)). The first of these (Kobune et al) discloses the pyroelectric properties of ceramics with the compositions: $PbZr_xTi_{1-x}O_3$-0.5 Wt. % MnO with x=0.1 to 0.5. These compositions contain no PMN, and the crystal structure of the compositions described by this reference are tetragonal.

Choi et al discloses the pyroelectric properties of ceramics in the $(1-X)Pb(Mg_{1/3}Nb_{2/3})O_3$-$XPbTiO_3$ solid solution. Here again, the crystal structure exhibited by of all the ceramics described is Letragonal. Furthermore, the structures contain no PZ. Finally, Abou Sekkina and Tawfik discloses the pyroelectric properties of ceramics with the composition $Pb_{1-y/2}(Zr_{1-(x+y)}Ti_xNb_y)O_3$. Here, the ceramics are rhombohedral but contain no Mg.

Pyroelectric ceramic materials are disclosed in Japanese patent publication nos. JP-01264962 and JP-020051426. Piezoelectric ceramics are described in European patent publication no. EP-A-0484231.

SUMMARY OF THE INVENTION

In carrying out the principles of the present invention, in accordance with an embodiment thereof, an improved ferroelectric ceramic is provided. The ferroelectric ceramic possesses particularly good pyroelectric figures-of-merit. The ferroelectric ceramic's properties can exceed those of the modified PT and PZ ceramics described above.

The ceramic is a composition comprising a solid solution between lead zirconate (PZ), lead titanate (PT) and lead magnesium niobate (PMN), doped with other elements such as manganese for electrical conductivity control. The compositions according to the invention are rhombohedral in structure.

The composition of the ceramic can be described by the following chemical formula:

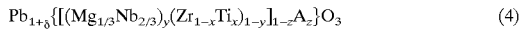

$$Pb_{1+\delta}\{[(Mg_{1/3}Nb_{2/3})_y(Zr_{1-x}Ti_x)_{1-y}]_{1-z}A_z\}O_3 \quad (4)$$

where: $0.05 \geq \delta \geq 0$ $0.4 \geq x \geq 0$ $0.4 \geq y > 0$ $0.05 \geq z > 0$ where A is a cationic multivalent octahedral site substituent such as manganese or uranium.

The cationic multivalent octahedral site substituent possesses multiple valency, and substitutes for Mg, Nb, Zr or Ti on the perovskite lattice site which is octahedrally coordinated by oxygen ions. Furthermore, the substituent is not valence-balanced by another simultaneous B-site substituent of higher or lower valency (e.g. Mn and Nb in the ratio of 1:2).

The preferred regions of the PMN-PZ-PT phase diagram are marked on the ternary phase diagram given in FIG. 2. (Note that this diagram assumes z=0 in the above formulation. The way the composition is formulated, small additions of z can be made without changing the relative proportions of PMIN, PZ or PT.)

Within the compositional range (4) defined above, the range:

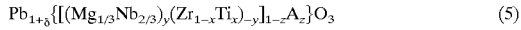

$$Pb_{1+\delta}\{[(Mg_{1/3}Nb_{2/3})_y(Zr_{1-x}Ti_x)_{-y}]_{1-z}A_z\}O_3 \quad (5)$$

where: $0.05 \geq \delta \geq 0$, preferably $0.02 \geq \delta \geq 0$ $0.25 \geq x > 0$ $0.24 \geq y > 0$ $0.88 \geq (1-x)(1-y)$ $0.05 \geq z > 0$ is of particular interest for pyroelectric applications.

The following compositions are especially preferred:

x=0.125±0.01, y=0.025±0.01, z=0.01±0.002, A=Mn;

x=0.075±0.01, y=0.075±0.01, z=0.01±0.002, A=Mn;

x=0.175±0.005, y=0.025±0.005, z=0.0065±0.001 and A=U.

The small excess of lead, represented by the parameter $\delta$ in the above formulae (4) and (5) has two effects. The first is to compensate for small losses of Pb by evaporation during sintering (see below). The second is that, together with the level of the off-valent dopant, it will have the effect of controlling the electrical conductivity of the sintered body. If $z \geq 0.002$, reducing $\delta$ will tend to reduce conductivity and vice-versa.

It should be noted that the relative proportions of the starting materials do not change during the production process, with the exception of the small losses of PbO caused by evaporation.

In practice, both x and y are usually greater than 0.01, and are preferably greater than 02. Furthermore, z is typically greater 0.001, and is preferably greater than 0.002. It is preferred that z is less than 0.02.

In another aspect, the invention provides the use as a pyroelectric of compositions comprising PMN-PZ-PT doped with a cationic multivalent octahedral site substituent such as manganese or uranium. Preferably, the PMN-PZ-PT ceramics have the composition described above.

The invention also provides a pyroelectric infrared detector having a pyroelectric material comprising PMN-PZ-PT doped with a cationic multivalent octahedral site substituent such as manganese or uranium. Preferably, the PMIN-PZ-PT ceramics have the composition described above.

In another aspect the invention provides a pyroelectric infrared detecting device comprising a plurality of detector elements in the form of a two dimensional array linked to a silicon multiplexor amplifier chip. The active material in pyroelectric detector elements comprises PMN-PZ-PT doped with a cationic multivalent octahedral site substituent such as manganese or uranium. Preferably, the PMN-PZ-PT ceramics have the composition described above.

These and other features, advantages, benefits and objects of the present invention will become apparent to one of ordinary skill in the art upon careful consideration of the detailed description of representative embodiments of the invention hereinbelow and the accompanying drawings.

DETAILED DESCRIPTION

Figure 1:
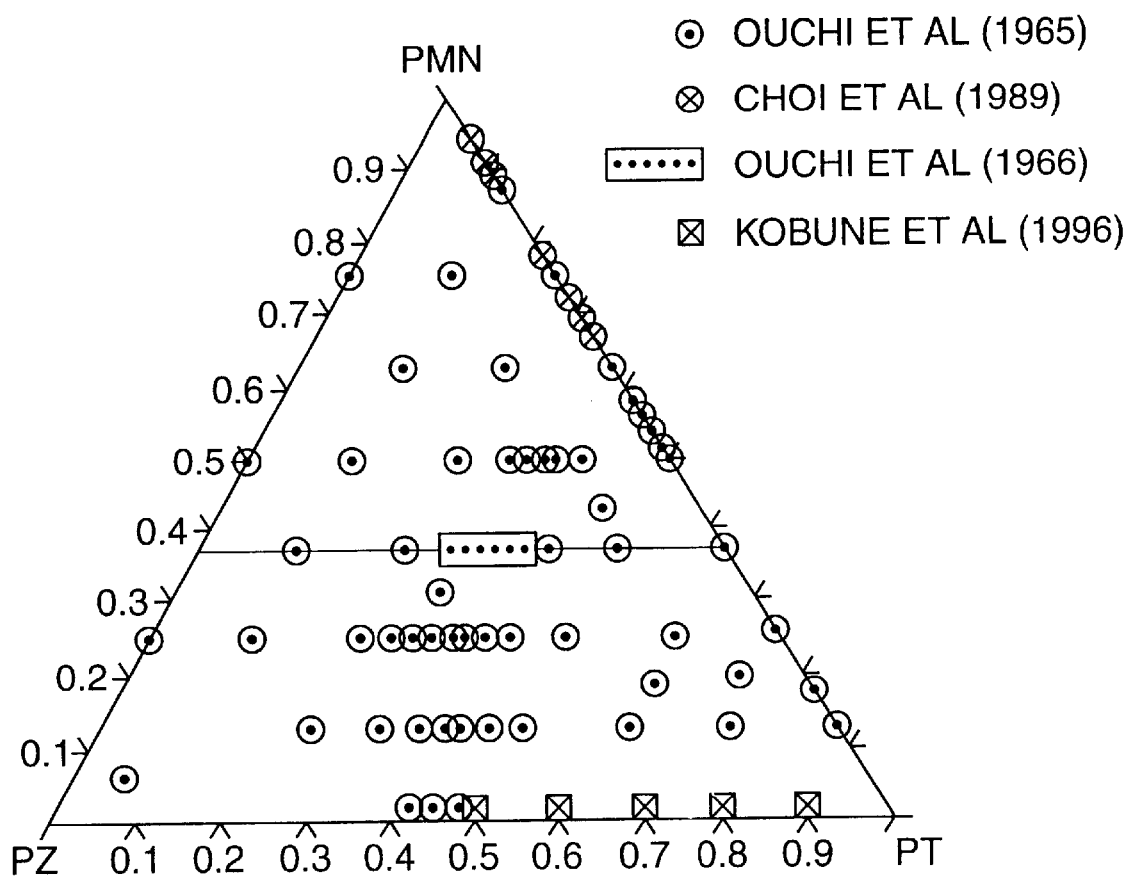
FIG. 1 is a ternary phase diagram for PZ-PT-PMN showing compositions described by H. Ouchi, K. Nagano and S. Hayakawa in the paper discussed above (Ouchi 1965), and showing compositions described in other papers discussed above.
Figure 2:
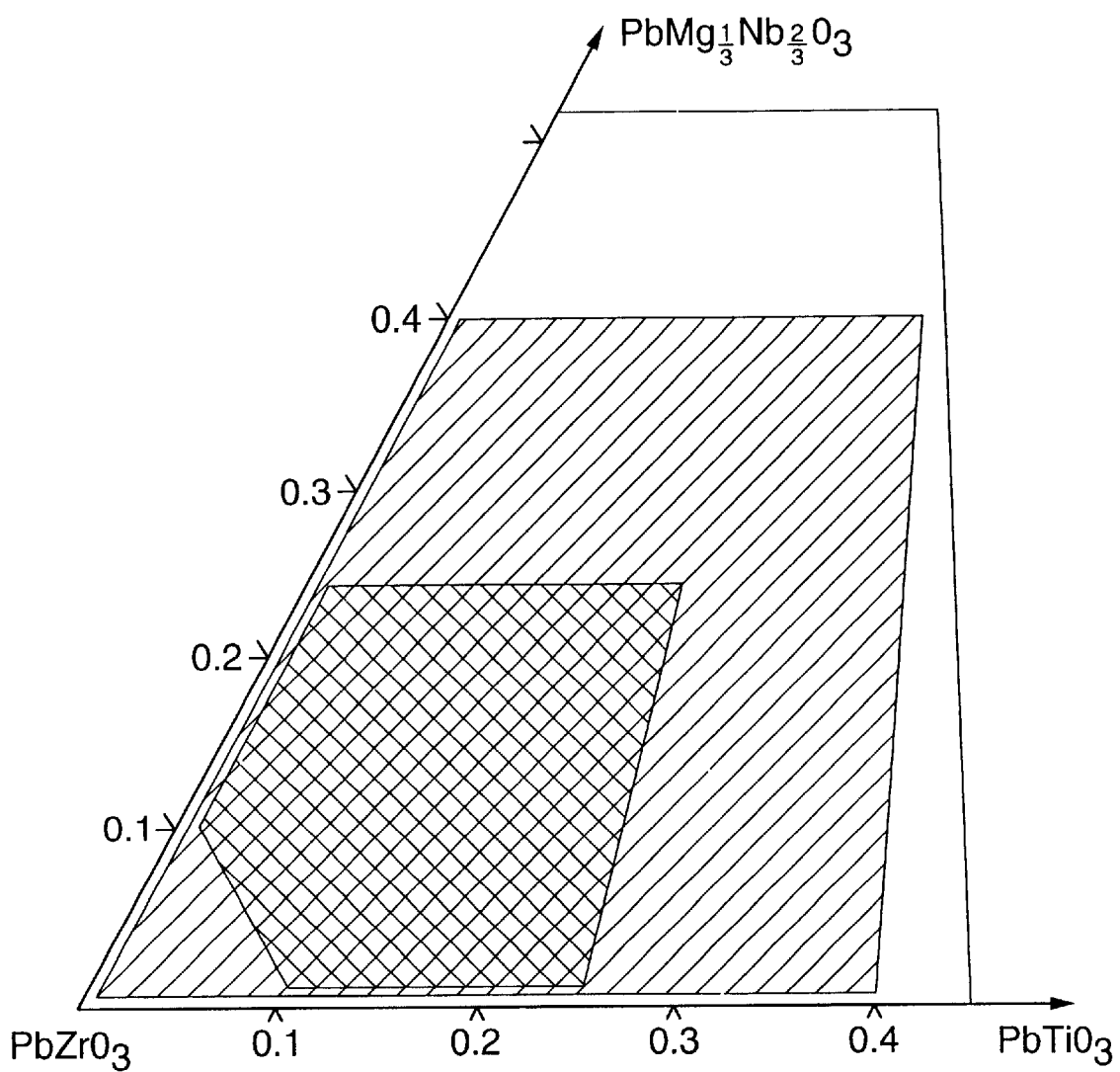
FIG. 2 is a ternary phase diagram for PZ-PT-PMN showing the regions specified in formula (4) above aid the regions specified in formula (5) above, wherein it is assumed that z=0, the composition is formulated in such a way that small additions of z can be made without changing the relative proportions of PMN, PZ or PT, formula (4) has been modified so that x and y are greater than 0.01, and formula (5) has been modified so that x and y are greater than 0.02.

There will now be described a way of making ferroelectric ceramics in accordance with the principles of the present invention. It will be appreciated that the ferroelectric ceramics may be made by other methods incorporating The composition selected is used to calculate the amounts of starting compounds which are required to make the final material. The usual starting compounds are basic magnesium carbonate ($MgCO_3.6H_2O$), niobium pertoxide ($Nb_2O_5$), titanium dioxide ($TiO_2$), zirconium dioxide ($ZrO_2$), lead monoxide (PbO) and manganese dioxide ($MnO_2$). In each case it is highly desirable to use very finely divided powders for the fabrication and to ensure that the powders are at least 99.9% purity. Alternative starting materials are discussed below.

The basic magnesium carbonate and niobium pentoxide powders are first weighed in equi-molar proportions and placed in a cylindrical receptacle (ball mill) filled with hard balls or cylinders (the milling medium) and a fluid medium for a process known as ball milling. In a specific, and optimum, example, the cylinders are made out of a ceramic known as yttria-stabilised zirconia and the medium is pure water, and the ball mill is made of polyethylene. A commercial dispersant such as "Dispex" can be added to aid the ball milling process. Alternatively, the milling medium can be acetone, the ball mill made of rubber lined steel and the milling medium steel balls. Any combination of these could be used successfully in this embodiment of the invention. The powders are ball milled for 6 hours, although a period between 4 and 12 hours would be successful The resulting slurry is taken out of the ball mill and placed in a flat tray in an oven at between 60 and 90° C. to dry. As an alternative, the slurry can be dried in a spray-dryer. The resulting powder is sieved through a 200 µm mesh sieve and in a crucible inside a furnace at a temperature between 800and 990° C. for a period between 4 and 12 hours. The resulting compound is $MgNb_2O_6$. This is used as a starting oxide for making the required ceramic powder.

A specific example of how to process a composition with $x=0.075$, $y=0.075$, $z=0.01$, $\delta=0.01$ will now follow.

The following weights of powders should be used:

| Compound | Weight (g) |
| --- | --- |
| PbO | 56.355 |
| $TiO_2$ | 1.372 |
| $ZrO_2$ | 26.094 |
| $MgNb_2O_6$ | 1.894 |
| $MnO_2$ | 0.217 |

Clearly, this is an example and any weights of the powders can be used as long as they are kept in the above proportions by weight.

The powders are weighed-out into a ball mill of the type described above and ball milled for a period of between 4 and 12 hours, with 6 hours being the optimum, using water with a suitable dispersant as the milling medium. The resulting slurry is dried as described above, sieved and the powders are placed in an alumina crucible and heated to between 800 and 900° C. for at least 4 hours, with 6 hours being the optimum. This process is known as calcination.

After calcination, the powders are again placed in a ball mill and ball milled for a period of between 6 and 24 hours, with 18 hours being the optimum, using water with a suitable dispersant as the milling medium. For the last hour of the milling process an organic polymer is added to the milling slurry as a binder. This binder can be a range of commercial materials, but a suitable example is a 50% mixture of polyvinyl alcohol and polyethylene glycol in water as solvent. The binder is typically added to the slurry at a proportion of between 2 and 6 percent by weight of the powder present in the slurry. The resulting slurry is dried as described above, with frequent stirring if in a flat tray, the resulting stock powder is sieved and placed in a suitable receptacle for storage.

The stock powder is used to make the ceramic in the following fashion. In the first example, the stock powder is placed in a steel punch and die set and compressed to form a "green" pellet of the required dimensions. Typically the pressure used to achieve this would be between 100 and 160 MPa. Typically, several pellets would be pressed and processed simultaneously The pellets are first placed side-by side on an open alumina tray in a furnace and heated slowly (typically 300° C./hour) to a temperature of between 500 and 700° C. This process eliminates the binder freon the compacts. These compacts, which are then said to be "biscuited", are stacked on top of each other on top of an alumina plate which has been lapped flat. Typically, a fine layer of a calcined lead zirconate powder is placed between each compact to stop them sticking together during the sintering process. Alternatively, thin platinum foil can be used for this task. An alumina crucible whose edges have also been lapped flat to make a good seal to the alumina plate is then placed over the compacts. In a further variation of the process, pre-calcined lead zirconate powder or a powder of the same composition as the compacts can be placed inside the crucible assembly. The whole assembly is placed inside a furnace and heated to a temperature of between 1200 and 1290° C. for a time of between 2 and 8 hours. Heating and cooling rates are typically 600° C./hour. This completes the sintering process. The resulting sintered ceramic pellets can then be separated, cleaned and cut into wafers of the required dimensions using a diamond saw.

In other embodiments of this invention, the stock powder can be formed into pellets using cold isostatic pressing. Alternatively, the powder can be formed into plates or sheets using a process such as tape casting or other shaped bodies by injection moulding. In the latter cases, other binders, well known to those skilled in the art, would be used to form the green bodies. In any case, the green bodies would be biscuited and sintered as described above. Other processes which can be applied to make the sintered bodies would be hot Biniaxial or hot isostatic pressing.

The ceramic wafers or bodies produced using one of the processes discussed above must have electrodes applied and be subject to the process known as electrical poling before they can be used in practical devices. Electrodes can be applied to wafers or discs using one of a variety of processes. A typical process would be to paint silver powder dispersed in an organic medium onto both surfaces of a wafer. This will make a conducting layer which can be made more durable if a small proportion of glass is included in the electrode by firing the wafer, typically at 700° C. Alternatively, an electrode such as a thin (typically 5 nm) layer of chromium, topped by a thicker (typically 100 nm) layer of gold can be used. These can be deposited using one of a number of physical vapour deposition methods such as thermal evaporation or sputtering, again well known to those skilled in the art. The electroded wafer is placed in a medium designed to have a high electrical breakdown strength, such as paraffin oil, and heated to a temperature of between 100 and 150° C. An electrical potential difference of 3000 V per mm of sample thickness is applied to the sample electrodes and the sample is cooled to room temperature over a period of typically 15 to 60 mins. After this, the samples can be cleaned in suitable solvents. This completes the poling process.

The relevant properties obtained from a selection of ceramic specimens contained within the range defined above will now be described. A set of compositions and the weight proportions of the oxides going to make them up is described in Table 2. Table 3 lists the electrical properties of some of these compositions. Of these, compositions 3 and 6 are particularly interesting for pyroelectric applications.

Table 4 shows an example of the effect of uranium substitution on DC electrical resistivity for a set of composition compared with a similar composition doped with Mn.

Examples will now be given of methods which can be used for making pyroelcttic detectors of electromagnetic radiation using the materials described above. After electrical poling, the wafers are lapped and polished to thicknesses of between 20 and 200 $\mu$m, the precise value determined by the performance required from the device. An electrode is applied, typically the evaporated or sputtered chromium/gold combination as described above to one face (the back face) of the wafer and a nickel/chromium alloy electrode possessing a surface resistivity of 377 $\Omega$/square to the other (front) face. This is the face exposed to the radiation to be detected in the final device. The wafer is then cut into detector elements, typically squares of between 100 $\mu$m and 5 mm on a side, and the elements are placed inside a package with a high input impedance amplifier and suitable electrical biasing circuitry. The package is designed to have a front window which is transparent to the radiation to be detected. Typically, but riot exclusively, this would be infra-red radiation with a wavelength of between 3 $\mu$m and 14 $\mu$m and the window would be a material such as silicon or gerinranlum with a thin-film radiation-wavelength selective filter deposited on it.

Figure 3:
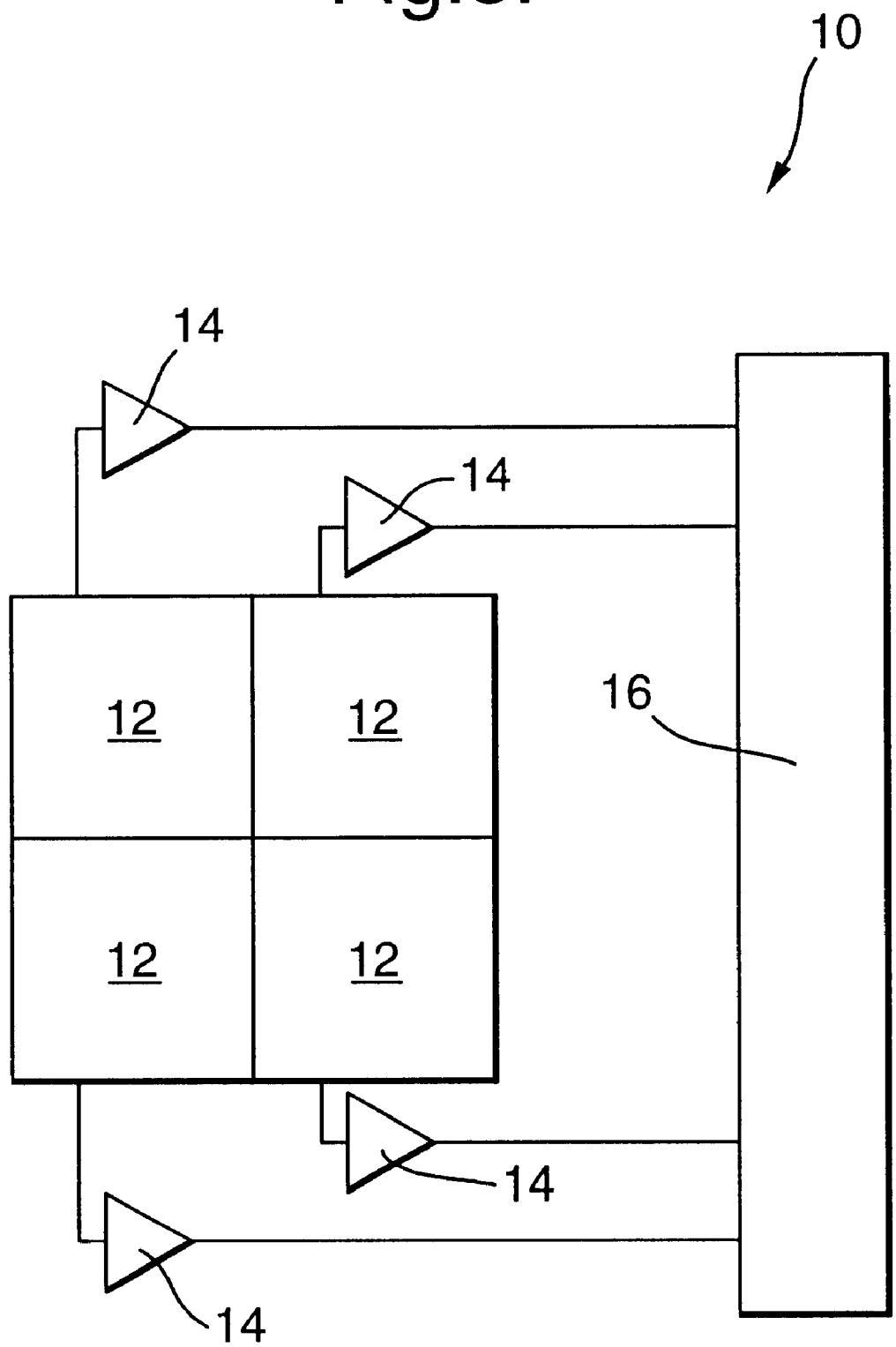
FIG. 3 is a pyroelectric infra-red detecting device embodying principles of the present invention.

Referring now to FIG. 3, as a further variant, a pyiroei.ectric device 10 can consist of a plurality of detector elements 12 in a two.-dimensional array in which each element is equipped with its own amplifier 14 and all the amplifier outputs are linked to a multiplexer circuit 16, all integrated onto one piece of silicon. In this case the pyroelectric ceramic wafer has many element electrode areas defined upon it by photolithography and each element 12 may be linked to the input of an ampllfier 14 by the means of a suitable interconnection technology such as one of the flip-chip hybridisation methods (e.g. solder bump, gold bump or conducting epoxy bump), which are well known to those skilled in the art of semiconductor device interconnection.

Of course, a person skilled in the art would, upon a careful consideration of the above description of representative embodiments of the invention, readily appreciate that many modifications, additions, substitutions, deletions, and other changes may be made to these specific embodiments, and such changes are contemplated by the principles of the present invention. Accordingly, the foregoing detailed description is to be clearly understood as being given by way of illustration and example only, the spirit and scope of the present invention being limited solely by the appended claims.

TABLE 1

Properties of some typical commercial pyroelectric materials

| Material | Type | p $10^{-4}$ Cm$^{-2}$ K$^{-1}$ | Dielectric Properties at 33 Hz | | c' $10^6$ Jm$^{-3}$ K$^{-1}$ | $F_V$ m$^2$ C$^{-1}$ | $F_D$ $10^{-5}$ Pa$^{-1/2}$ |
|---|---|---|---|---|---|---|---|
| | | | $\epsilon$ | tan $\delta$ | | | |
| Modified PZ | Ceramic | 4 | 300 | 0.014 | 2.5 | 0.06 | 2.6 |
| Modified PT | Ceramic | 3.5 | 220 | 0.03 | 2.5 | 0.08 | 1.9 |

TABLE 2

Relative weights of oxides constituent in the ceramics described in this patent.

| Comp. No. | Code | 100x $\delta$ | 100x x | 100x y | 100x z | PbO Wt (g) | TiO2 Wt (g) | ZrO2 Wt (g) | MgNb2O6 Wt (g) | MnO2 Wt (g) | Total Wt (g) |
|---|---|---|---|---|---|---|---|---|---|---|---|
| 2 | P101MNZTM7.5/2.5/1 | 1 | 7.5 | 2.5 | 1 | 56.355 | 1.446 | 27.504 | 0.631 | 0.217 | 86.154 |
| 3 | P101MNZTM12.5/2.5/1 | 1 | 12.5 | 2.5 | 1 | 56.355 | 2.410 | 26.018 | 0.631 | 0.217 | 85.631 |
| 6 | P101MNZTM7.5/7.5/1 | 1 | 7.5 | 7.5 | 1 | 56.355 | 1.372 | 26.094 | 1.894 | 0.217 | 85.932 |
| 7 | P101MNZTM12.5/7.5/1 | 1 | 12.5 | 7.5 | 1 | 56.355 | 2.286 | 24.683 | 1.894 | 0.217 | 85.436 |
| 8 | P101MNZTM2.5/12.5/1 | 1 | 2.5 | 12.5 | 1 | 56.355 | 0.432 | 26.018 | 3.157 | 0.217 | 86.180 |
| 9 | P101MNZTM7.5/12.5/1 | 1 | 7.5 | 12.5 | 1 | 56.355 | 1.297 | 24.683 | 3.157 | 0.217 | 85.710 |
| 10 | P101MNZTM7.5/7.5/0.5 | 1 | 7.5 | 7.5 | 0.5 | 56.355 | 1.378 | 26.226 | 1.904 | 0.109 | 85.972 |
| 11 | P101MNZTM7.5/7.5/1.5 | 1 | 7.5 | 7.5 | 1.5 | 56.355 | 1.365 | 25.962 | 1.884 | 0.326 | 85.893 |
| 21 | P101MNZTM12.5/12.5/1 | 1 | 12.5 | 12.5 | 1 | 56.355 | 2.162 | 23.349 | 3.157 | 0.217 | 85.241 |

TABLE 3

Electrical properties of some selected ceramic compositions

| Composition No. | Code | Resistivity $10 \cdot \Omega \cdot m$ | Dielectric Constant (33 Hz) | Dielectric Loss Tang. (33 Hz) | Pyroelectric Coefficient $10^{-4}$ Cm$^{-2}$ K$^{-1}$ | $F_V$ $10^{-2}$ m$^2$ C$^{-1}$ | $F_D$ $10^{-5}$ Pa$^{-0.5}$ |
|---|---|---|---|---|---|---|---|
| 2 | P101MNZTM7.5/2.5/1 | 1.0 | 186 | 0.0072 | 2.81 | 6.80 | 3.26 |
| 3 | P101MNZTM12.5/2.5/1 | 1.1 | 196 | 0.0049 | 3.08 | 7.10 | 4.23 |
| 6 | P101MNZTM7.5/7.5/1 | 8.30 | 192 | 0.0065 | 3.17 | 7.46 | 3.81 |
| 7 | P101MNZTM12.5/7.5/1 | 3.46 | 217 | 0.0095 | 3.05 | 6.35 | 2.86 |
| 8 | P101MNZTM2.5/12.5/1 | 3.47 | 266 | 0.017 | 2.22 | 3.77 | 1.40 |
| 9 | P101MNZTM7.5/12.5/1 | 152.00 | 218 | 0.0073 | 3.56 | 7.38 | 3.79 |
| 10 | P101MNZTM7.5/7.5/0.5 | 665.00 | 231 | 0.006 | 3.05 | 5.96 | 3.48 |
| 11 | P101MNZTM7.5/7.5/1.5 | 0.29 | 173 | 0.006 | 3.13 | 8.17 | 4.13 |
| 21 | P101MNZTM12.5/12.5/1 | 0.55 | 260 | 0.014 | 2.58 | 4.48 | 1.82 |

TABLE 4

Resistivity Properties of Uranium-substituted compositions

| Sample Code | A | x | y | z | Resistivity $\Omega$m |
|---|---|---|---|---|---|
| S4 | Mn | 0.175 | 0.025 | 0.01 | $1.97 \times 10^{11}$ |
| SU1A | U | 0.175 | 0.025 | 0.0048 | $1.22 \times 10^{10}$ |
| SU5A | U | 0.175 | 0.025 | 0.0059 | $3.64 \times 10^9$ |
| SU4A | U | 0.175 | 0.025 | 0.0077 | $8.2 \times 10^8$ |
| SU2A | U | 0.175 | 0.025 | 0.011 | $2.26 \times 10^8$ |
| SU3A | U | 0.175 | 0.025 | 0.0145 | $1.02 \times 10^8$ |

What is claimed is:

1. A ferroelectric ceramic for use as a pyroelectric, said ceramic having the composition:

$$Pb_{1+\delta}\{[(Mg_{1/3}Nb_{2/3})_y(Zr_{1-x}Ti_x)_{1-y}]_{1-z}A_z\}O_3$$

where: $0.05 \geq \delta \geq 0$
$0.4 \geq x > 0$
$0.4 \geq y > 0$
$0.05 \geq z > 0$ and wherein A is a cationic multivalent octahedral site substituent.

2. The ferroelectric ceramic according to claim 1, wherein $0.25 \geq x > 0$, and $0.24 \geq y > 0$.
3. The ferroelectric ceramic according to claim 1, wherein A is manganese.
4. The ferroelectric ceramic according to claim 1, wherein A is uranium.
5. The ferroelectric ceramic according to claim 1, wherein $0.88 \geq (1-x)(1-y)$.
6. The ferroelectric ceramic according to claim 5, wherein A is manganese.
7. The ferroelectric ceramic according to claim 5, wherein A is uranium.
8. The ferroelectric ceramic according to claim 5, wherein $0.25 \geq x > 0$, and $0.24 \geq y > 0$.
9. The ferroelectric ceramic according to claim 8, wherein A is manganese.
10. The ferroelectric ceramic according to claim 8, wherein A is uranium.
11. The ferroelectric ceramic according to claim 1, wherein x=0.125±0.01, y=0.025±0.01, z=0.01±0.002, and A=Mn.
12. The ferroelectric ceramic according to claim 1, wherein x=0.075±0.01, y=0.075±0.01, z=0.01±0.002, and A=Mn.
13. The ferroelectric ceramic according to claim 1, wherein x=0.175±0.005, y=0.025±0.005, z=0.0065±0.001, and A=U.

14. A pyroelectric, comprising:
a ferroelectric ceramic having the composition:

$$Pb_{1+\delta}\{[(Mg_{1/3}Nb_{2/3})_y(Zr_{1-x}Ti_x)_{1-y}]_{1-z}A_z\}O_3$$

where: $0.05 \geq \delta \geq 0$
$0.4 \geq x > 0$
$0.4 \geq y > 0$
$0.05 \geq z > 0$ and wherein A is a cationic multivalent octahedral site substituent.

15. The pyroelectric according to claim 14, wherein $0.25 \geq x > 0$, and $0.24 \geq y > 0$.
16. The pyroelectric according to claim 14, wherein A is manganese.
17. The pyroelectric according to claim 14, wherein A is uranium.
18. The pyroelectric according to claim 14, wherein $0.88 \geq (1-x)(1-y)$.
19. The pyroelectric according to claim 18, wherein A is manganese.
20. The pyroelectric according to claim 18, wherein A is uranium.
21. The pyroelectric according to claim 18, wherein $0.25 \geq x > 0$, and $0.24 \geq y > 0$.
22. The pyroelectric according to claim 21, wherein A is manganese.
23. The pyroelectric according to claim 21, wherein A is uranium.
24. The pyroelectric according to claim 14, wherein x=0.125±0.01, y=0.025±0.01, z=0.01±0.002, and A=Mn.
25. The pyroelectric according to claim 14, wherein x=0.075±0.01, y=0.075±0.01, z=0.01±0.002, and A=Mn.
26. The pyroelectric according to claim 14, wherein x=0.175±0.005, y=0.025±0.005, z=0.0065±0.001, and A=U.

27. A pyroelectric infra-red detector, comprising:
an active pyroelectric material which is a ferroelectric ceramic having the composition:

$$Pb_{1+\delta}\{[(Mg_{1/3}Nb_{2/3})_y(Zr_{1-x}Ti_x)_{1-y}]_{1-z}A_z\}O_3$$

where: $0.05 \geq \delta \geq 0$
$0.4 \geq x > 0$
$0.4 \geq y > 0$
$0.05 \geq z > 0$ and wherein A is a cationic multivalent octahedral site substituent.

28. The detector according to claim 27, wherein $0.25 \geq x > 0$, and $0.24 \geq y > 0$.
29. The detector according to claim 27, wherein A is manganese.

30. The detector according to claim 27, wherein A is uranium.

31. The detector according to claim 27, wherein $0.88 \geq (1-x)(1-y)$.

32. The detector according to claim 31, wherein A is manganese.

33. The detector according to claim 31, wherein A is uranium.

34. The detector according to claim 31, wherein $0.25 \geq x > 0$, and $0.24 \geq y > 0$.

35. The detector according to claim 34, wherein A is manganese.

36. The detector according to claim 34, wherein A is uranium.

37. The detector according to claim 27, wherein $x=0.125\pm0.01$, $y=0.25\pm0.01$, $z=0.01\pm0.002$, and A=Mn.

38. The detector according to claim 27, wherein $x=0.075\pm0.01$, $y=0.075\pm0.01$, $z=0.01\pm0.002$, and A=Mn.

39. The detector according to claim 27, wherein $x=0.175\pm0.005$, $y=0.025\pm0.005$, $z=0.0065\pm0.001$, and A=U.

40. A pyroelectric infra-red detecting device, comprising:
   a plurality of detector elements in the form of a two dimensional array linked to a silicon multiplexer amplifier chip, wherein the detector elements comprise an active material which is a ferroelectric ceramic having the composition:

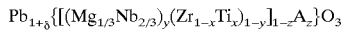

where: $0.5 \geq \delta \geq 0$
   $0.4 \geq x > 0$
   $0.4 \geq y > 0$
   $0.05 \geq z > 0$ and wherein A is a cationic multivalent octahedral site substituent.

41. The device according to claim 40, wherein $0.25 \geq x > 0$, and $0.24 \geq y > 0$.

42. The device according to claim 40, wherein A is manganese.

43. The device according to claim 40, wherein A is uranium.

44. The device according to claim 40, wherein $0.88 \geq (1-x)(1-y)$.

45. The device according to claim 44, wherein A is manganese.

46. The device according to claim 44, wherein A is uranium.

47. The device according to claim 44, wherein $0.25 \geq x > 0$, and $0.24 \geq y > 0$.

48. The device according to claim 47, wherein A is manganese.

49. The device according to claim 47, wherein A is uranium.

50. The device according to claim 40, wherein $x=0.125\pm0.01$, $y=0.025\pm0.01$, $z=0.01\pm0.002$, and A=Mn.

51. The device according to claim 40, wherein $x=0.075\pm0.01$, $y=0.075\pm0.01$, $z=0.01\pm0.002$, and A=Mn.

52. The device according to claim 40, wherein $x=0.175\pm0.005$, $y=0.025\pm0.005$, $z=0.0065\pm0.001$, and A=U.

53. A pyroelectric, comprising:
   a ferroelectric ceramic having the composition:

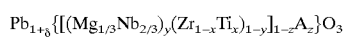

where: $0.05 \geq \delta \geq 0$
   $1 > x > 0$
   $1 > y > 0$
   $0.5 \geq z > 0$ and wherein A is a cationic multivalent octahedral site substituent.

54. A pyroelectric infra red detector having an active pyroelectric material which is a ferroelectric ceramic having the composition:

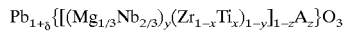

where: $0.5 \geq \delta \geq 0$
   $1 > x > 0$
   $1 > y > 0$
   $0.05 \geq z > 0$ and wherein A is a cationic multivalent octahedral site substituent.

55. A pyroelectric infra-red detecting device comprising a plurality of detector elements in the form of a two dimensional array linked to a silicon multiplexer amplifier chip, wherein the detector elements comprise an active material which is a ferroelectric ceramic having the composition:

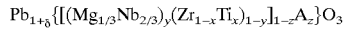

where: $0.05 \geq \delta \geq 0$
   $1 > x > 0$
   $1 > y > 0$
   $0.05 \geq z > 0$ and wherein A is a cationic multivalent octahedral site substituent.

* * * * *